United States Patent
Varghese

(10) Patent No.: US 11,557,515 B2
(45) Date of Patent: Jan. 17, 2023

(54) METHODS FOR SUB-LITHOGRAPHY RESOLUTION PATTERNING

(71) Applicant: Applied Materials, Inc., Santa Clara, CA (US)

(72) Inventor: Sony Varghese, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 16/989,019

(22) Filed: Aug. 10, 2020

(65) Prior Publication Data

US 2022/0044966 A1 Feb. 10, 2022

(51) Int. Cl.
H01L 21/768 (2006.01)

(52) U.S. Cl.
CPC .. H01L 21/76886 (2013.01); H01L 21/76816 (2013.01); H01L 21/76877 (2013.01); H01L 21/76885 (2013.01)

(58) Field of Classification Search
CPC ......... H01L 21/76816; H01L 21/76885; H01L 21/76886; H01L 21/76877
See application file for complete search history.

(56) References Cited

U.S. PATENT DOCUMENTS

| 9,478,422 | B2* | 10/2016 | Davis | ................. H01B 13/0026 |
| 2015/0376778 | A1* | 12/2015 | Davis | ................ H01L 21/02395 |
| | | | | 430/323 |

OTHER PUBLICATIONS

Bin Lung Yu et al. "APF Hard Mask Distortion Improvement for High Aspect Ratio Patterning"; 3 pages.
Vikram Iyengar et al. "Collapse-Free Patterning of High Aspect Ratio Silicon"; ASMC 2015; 5 pages.
Matthias M. Minjauw et al. "Chemical selectivity and nucleation during ALD of Ru with the Ru04-precursor"; 37 pages.

* cited by examiner

*Primary Examiner* — Phat X Cao
(74) *Attorney, Agent, or Firm* — KDB Firm PLLC

(57) ABSTRACT

Disclosed are approaches for forming a semiconductor device. In some embodiments, a method may include providing a plurality of patterning structures over a device layer, each of the plurality of patterning structures including a first sidewall, a second sidewall, and an upper surface, and forming a mask by depositing a masking material at a non-zero angle of inclination relative to a perpendicular to a plane defined by a top surface of the device layer. The mask may be formed over the plurality of patterning structures without being formed along the second sidewall. The method may further include selectively forming a metal layer along the second sidewall of each of the plurality of patterning structures.

19 Claims, 7 Drawing Sheets

METHODS FOR SUB-LITHOGRAPHY RESOLUTION PATTERNING

FIELD OF THE DISCLOSURE

The present disclosure relates to semiconductor devices, and more particularly, to methods for sub-lithography resolution patterning.

BACKGROUND OF THE DISCLOSURE

Traditionally, metal lines in semiconductor devices have been formed by subtractive processes as well as damascene processes. Metal line widths have been trending towards widths of less than 10 nm. However, as line widths decrease, the cross-sectional area also decreases, causing resistance to increase. Furthermore, metal lines having a seed layer further reduce metal volume and increase resistance. It is with respect to these and other deficiencies of the prior art that the present disclosure is provided.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one approach, a method may include providing a plurality of patterning structures over a device layer, each of the plurality of patterning structures including a first sidewall, a second sidewall, and an upper surface. The method may further include forming a mask by depositing a masking material at a non-zero angle of inclination relative to a perpendicular to a plane defined by a top surface of the device layer, wherein the mask is formed over just the first sidewall and the upper surface of each of the plurality of patterning structures, and selectively forming a metal layer along the second sidewall of each of the plurality of patterning structures.

In another approach, a method of forming a semiconductor device may include providing a plurality of patterning structures over a device layer, each of the plurality of patterning structures including a first sidewall, a second sidewall, and an upper surface. The method may further include forming a mask by depositing a masking material at a non-zero angle of inclination relative to a perpendicular to a plane defined by a top surface of the device layer, wherein the mask is formed over just the first sidewall and the upper surface of each of the plurality of patterning structures, and forming a metal layer along just the second sidewall of each of the plurality of patterning structures.

In another approach, a metal line patterning method may include providing a plurality of patterning structures over a device layer, each of the plurality of patterning structures including a first sidewall, a second sidewall, and an upper surface. The method may further include forming a mask over each of the plurality of patterning structures by depositing a masking material at a non-zero angle of inclination relative to a perpendicular to a plane defined by a top surface of the device layer, wherein the masking material impacts just the first sidewall and the upper surface of each of the plurality of patterning structures, and selectively forming a metal layer along just the second sidewall of each of the plurality of patterning structures.

BRIEF DESCRIPTION OF THE DRAWINGS

By way of example, embodiments of the disclosure will now be described, with reference to the accompanying drawings, in which.

Figure 1:
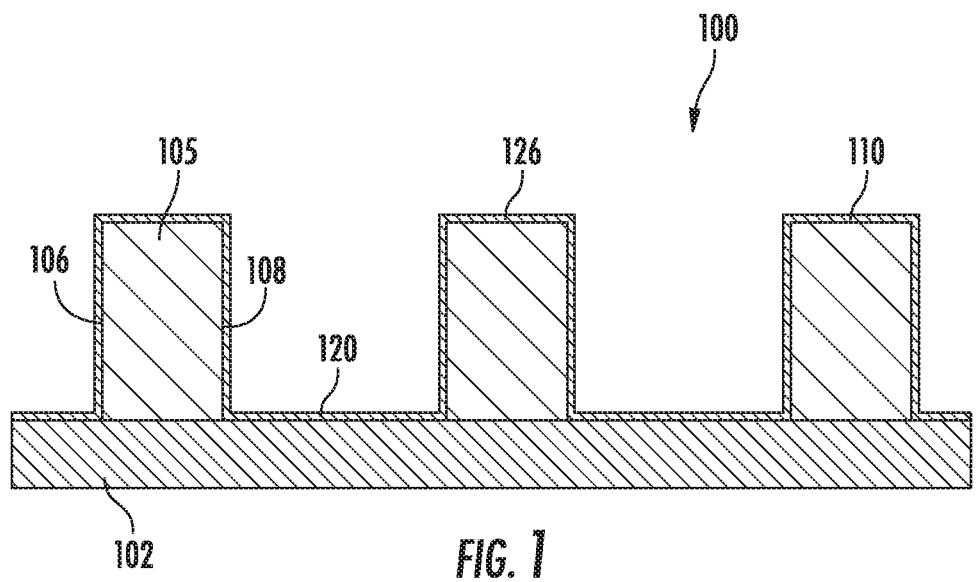
FIG. 1 is a side cross-sectional view of a device according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements. Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and semiconductor devices in accordance with the present disclosure will now be described more fully hereinafter with reference to the accompanying drawings, where embodiments of the methods are shown. The methods and semiconductor devices may be embodied in many different forms and are not to be construed as being limited to the embodiments set forth herein. Instead, these embodiments are provided so the disclosure will be thorough and complete, and will fully convey the scope of the system and method to those skilled in the art.

FIG. 1 depicts a side cross-sectional view of a semiconductor device (hereinafter "device") 100 in accordance with embodiments of the present disclosure. The device 100 may include a device layer 102, such as substrate or dielectric layer, and plurality of masking or patterning structures 105 formed over the device layer 102. As shown, each of the patterning structures 105 may include a first sidewall 106, a second sidewall 108, and an upper surface 110 connecting the first and second sidewalls 106, 108. In some embodiments, the patterning structures 105 may be formed by a relaxed lithography and etch process, wherein the patterning step may involve a self-aligned quadruple patterning (SAQP) process or a selective self-aligned double patterning (SADP) process or any lithography process that may be at a lower resolution than the desired final structure. Although non-limiting, the patterning structures 105 may be made from any known hardmask material, e.g., oxide, silicon, C, silicon nitride, and the like. In some embodiments, an optional seed layer 126 may be formed over exposed surfaces of the device 100, including over the first sidewall 106, the second sidewall 108, the upper surface 110 of the patterning structures 105, and over a top surface 120 of the device layer 102. Although non-limiting, the seed layer 126 may be a metal layer, such as copper, cobalt, nickel, gold, silver, manganese, tin, aluminum, ruthenium, and alloys thereof.

Figure 2A:
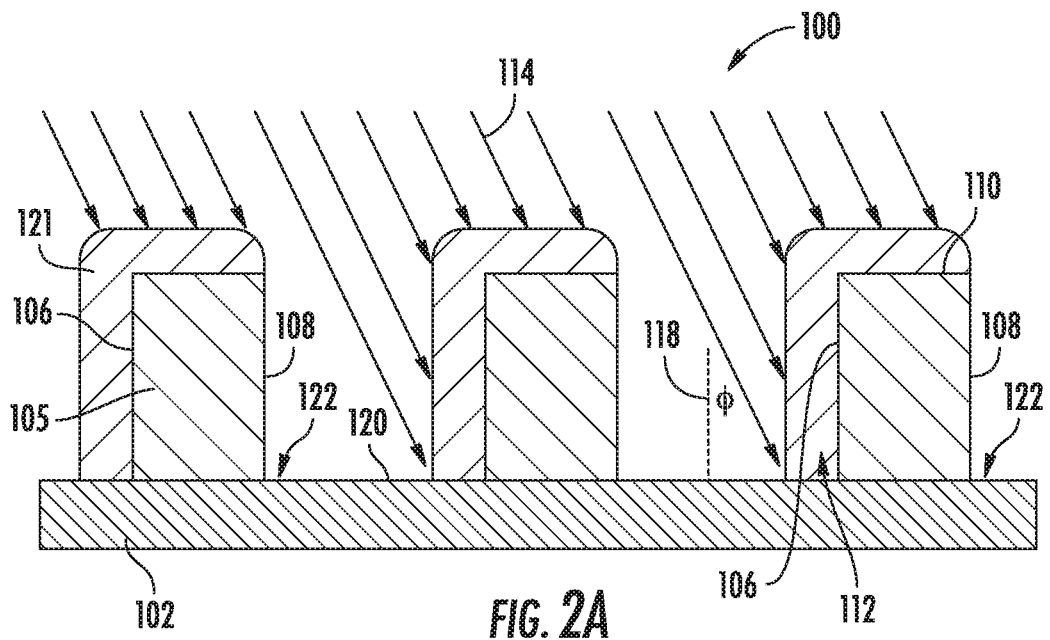
FIG. 2A is a side cross-sectional view of the device during mask formation according to embodiments of the present disclosure.

FIG. 2A depicts a side cross-sectional view of the device 100 during formation of a mask 112 over the patterning structures 105. In some embodiments, the mask 112 may be formed by a directional mask deposition process 114. More specifically, the directional mask deposition process 114 may deliver a masking material 121 (e.g., oxide, carbon, Nitride, Si, a self-assembled monolayer (SAM), etc.) at a non-zero angle of inclination $\phi$ relative to a perpendicular 118 to the top surface 120 of the device layer 102. In some embodiments, the non-zero angle of inclination may be selected so that the masking material 121 impacts just the first sidewall 106 and the upper surface 110 of each of the patterning structures 105. As shown, the top surface 120 between each of the patterning structures 105 is generally unaffected by the directional mask deposition process 114. Said another way, the masking material 121 generally does not form along the top surface 120 of the device layer 102 in an area 122 directly adjacent the second sidewall 108 of each of the patterning structures 105. As further shown, the mask 112 is prevented from being formed along the second sidewall 108 of each of the patterning structures 105. It will be appreciated that coverage by the masking material 121 is dependent on the non-zero angle of inclination $\phi$.

Figure 2B:
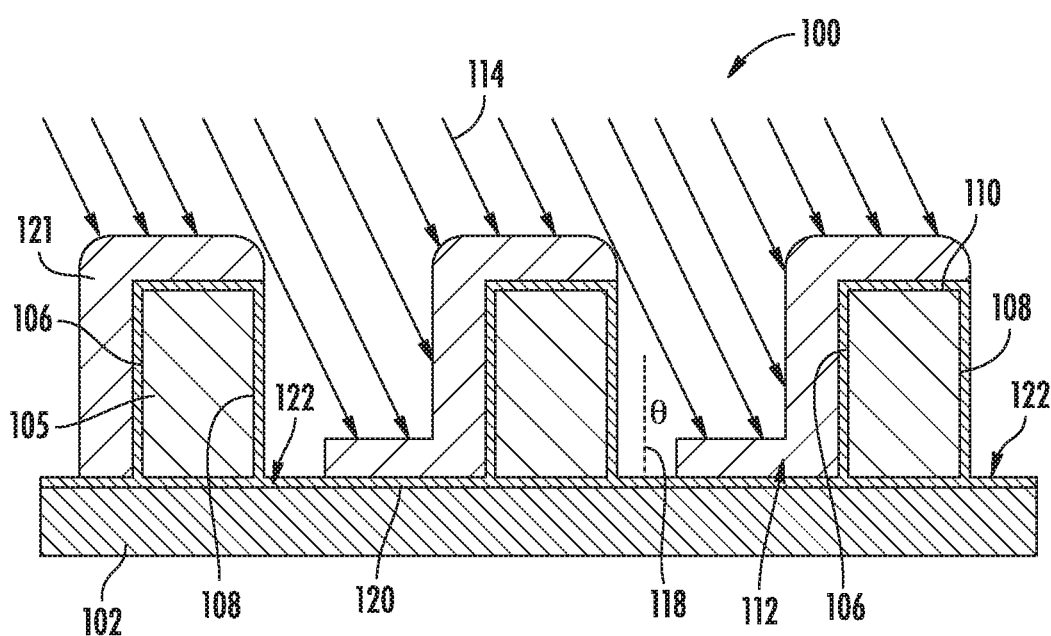
FIG. 2B is a side cross-sectional view of the device during mask formation atop a seed layer according to embodiments of the present disclosure.

FIG. 2B depicts a side cross-sectional view of the device 100 in the case the seed layer 126 is formed over exposed surfaces of the device 100. As shown, the mask 112 may be formed by a directional mask deposition process 114 atop the seed layer 126. More specifically, the directional mask deposition process 114 may deliver a masking material 121 (e.g., oxide, carbon, Nitride, Si, a self-assembled monolayer (SAM), etc.) at a non-zero angle of inclination $\kappa$ relative to a perpendicular 118 to the top surface 120 of the device layer 102. In some embodiments, the non-zero angle of inclination $\kappa$ may be selected so that the masking material 121 impacts the first sidewall 106, the upper surface 110 of each of the patterning structures 105, as well as the top surface 120 of the device layer 102. As shown, just a portion of the top surface 120 between each of the patterning structures 105 is impacted by the directional mask deposition process 114. Said another way, the masking material 121 generally does not form along the top surface 120 of the device layer 102 in an area 122 directly adjacent the second sidewall 108 of each of the patterning structures 105. The area 122 may be left uncovered by the masking material 121 to make room for a subsequently formed metal along the second sidewall 108 of each of the patterning structures 105, as will be described in further detail below. In this embodiment, the mask 112 is also prevented from being formed along the second sidewall 108 of each of the patterning structures 105. It will be appreciated that coverage by the masking material 121 is dependent on the non-zero angle of inclination $\kappa$.

Figure 3A:
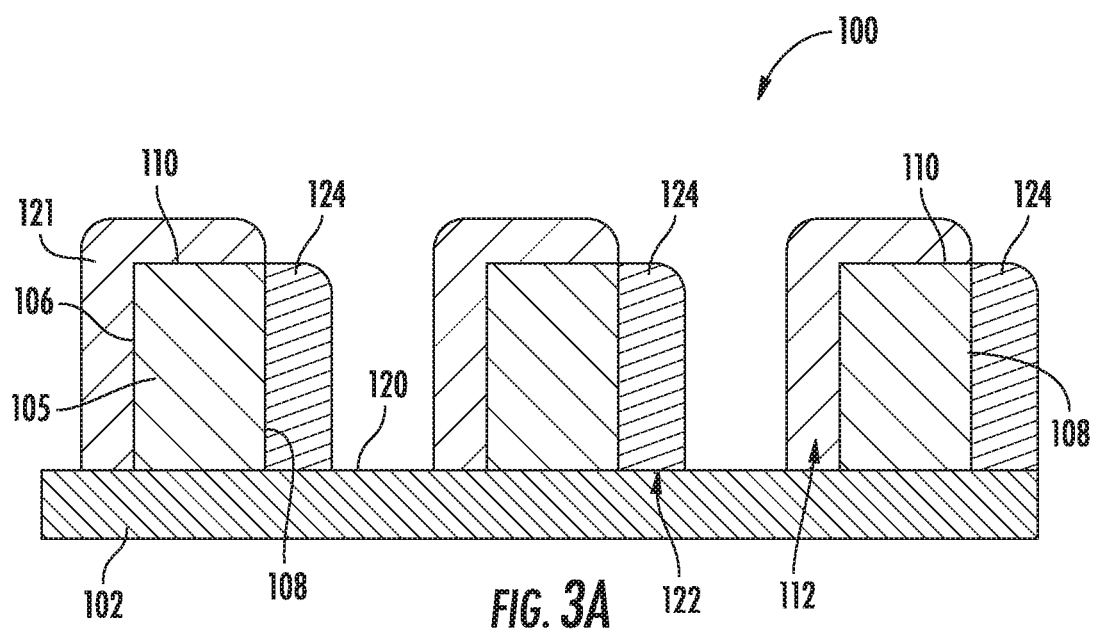
FIG. 3A is a side cross-sectional view of the device according to embodiments of the present disclosure.
Figure 3B:
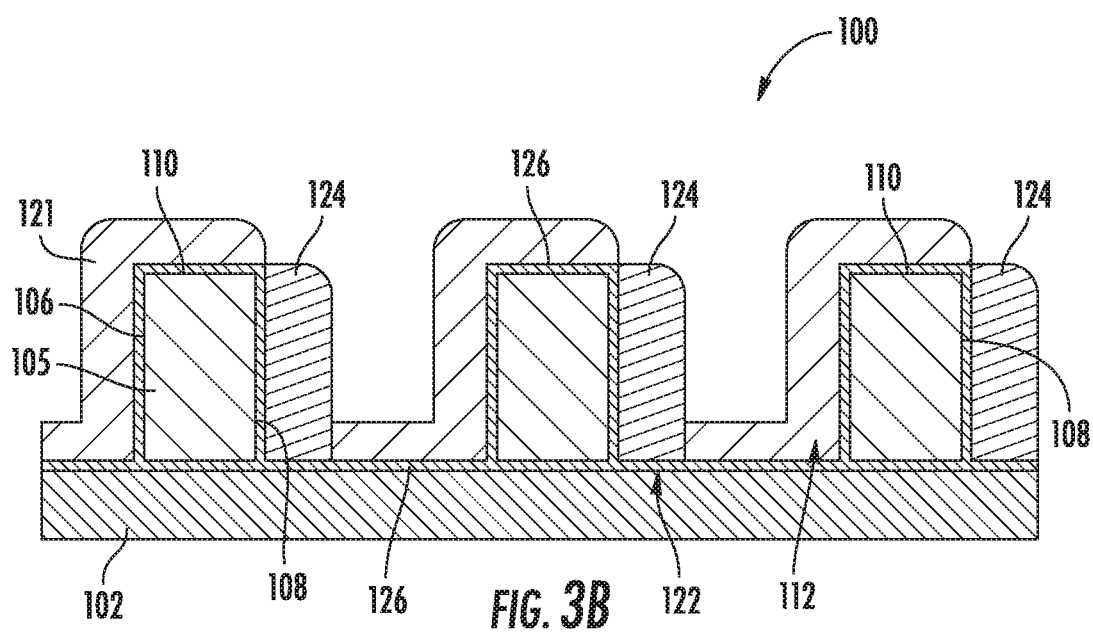
FIG. 3B is a side cross-sectional view of the device including a metal layer along a seed layer according to embodiments of the present disclosure.

As shown in FIGS. 3A-3B, a metal layer 124 may be formed along the second sidewall 108 of each of the patterning structures 105. In some embodiments, the metal layers 124 may be formed by a selective atomic layer deposition (ALD) process. In other embodiments, the metal layers 124 may be formed by a chemical vapor deposition (CVD) process or electrochemical deposition. As shown, each metal layer 124 generally extends from the top surface 120 of the device layer 102 to the upper surface 110 of each of the patterning structures. The metal layers 124 are prevented from being formed along the upper surface 110 and the first sidewall 106 of the patterning structures 105. Although non-limiting, the metal layer may be ruthenium (Ru), cobalt (Co), molybdenum (Mo), or tungsten (W). In other embodiments, a dielectric may be formed along the second sidewall 108 of each of the patterning structures 105. In embodiments in which the seed layer 126 is present, e.g., as shown in FIG. 3B, the mask 112 and the metal layers 124 may be formed over the seed layer 126. As shown, each metal layer 124 may be formed in the area 122 directly adjacent the second sidewall 108 of each of the patterning structures 105. Due to the presence of the mask 112 along the top surface 120 of the device layer 102, lateral growth of the metal layer 124 is restricted.

Figure 4A:
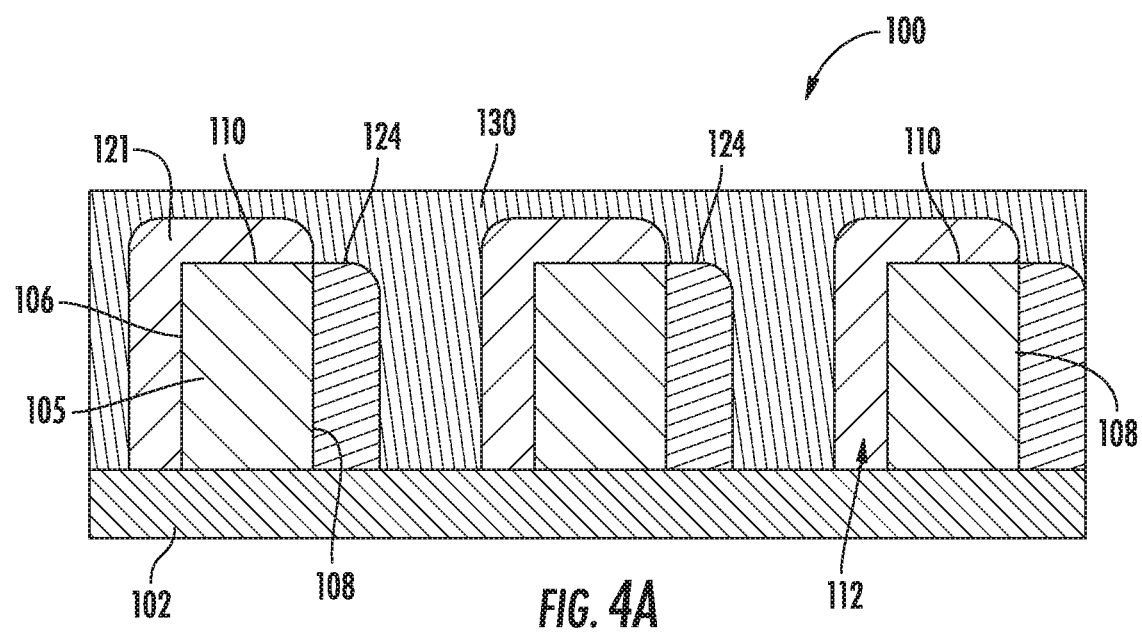
FIG. 4A is a side cross-sectional view of a fill material formed over the device according to embodiments of the present disclosure.
Figure 4B:
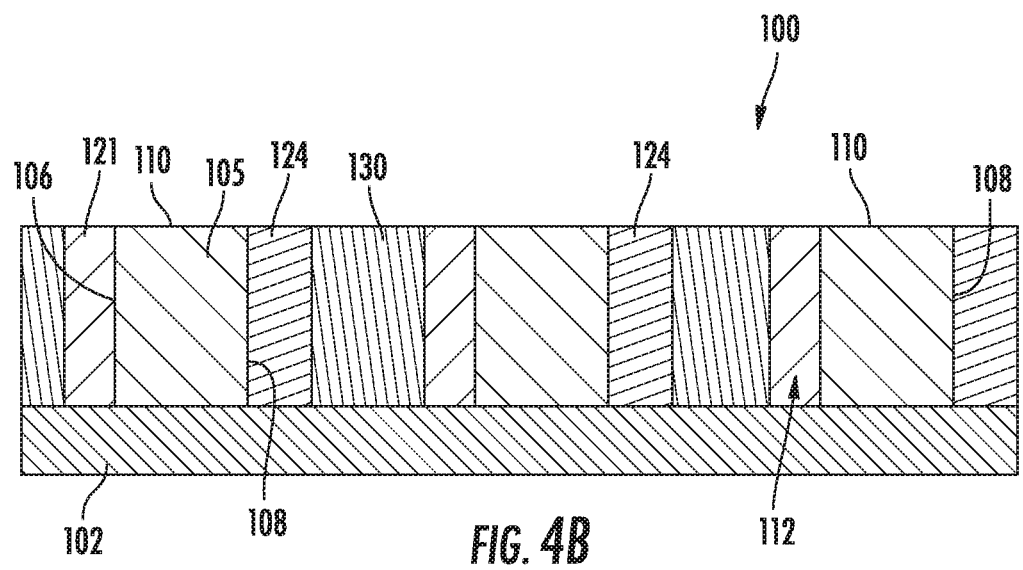
FIG. 4B is a side cross-sectional view of the device following a planarization process according to embodiments of the present disclosure.

Next, as shown in FIG. 4A, a fill material 130 may be formed over the patterning structures 105 and the device layer 102, including over the mask 112 and the metal layers 124, and then planarized, as shown in FIG. 4B. The planarization may remove the mask 112 from the upper surface 110 of each of the patterning structures 105. In some embodiments, the planarization process may be a CMP and/or etch. In some embodiments, the planarization process may partially recess the mask 112, the patterning structures 105, and the metal layers 124. Although non-limiting, the fill material 130 may be a gap fill oxide or nitride. In another embodiment the mask material 121 may be removed before the fill material 130 is formed.

Figure 5A:
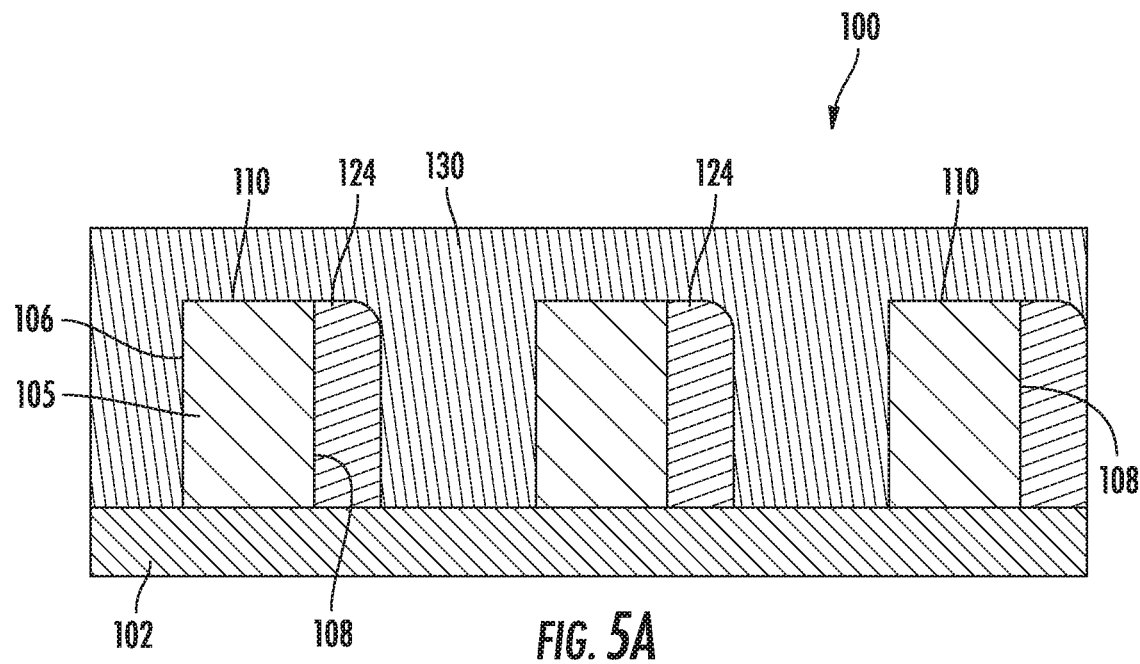
FIG. 5A is a side cross-sectional view of a fill material formed over the device according to embodiments of the present disclosure.
Figure 5B:
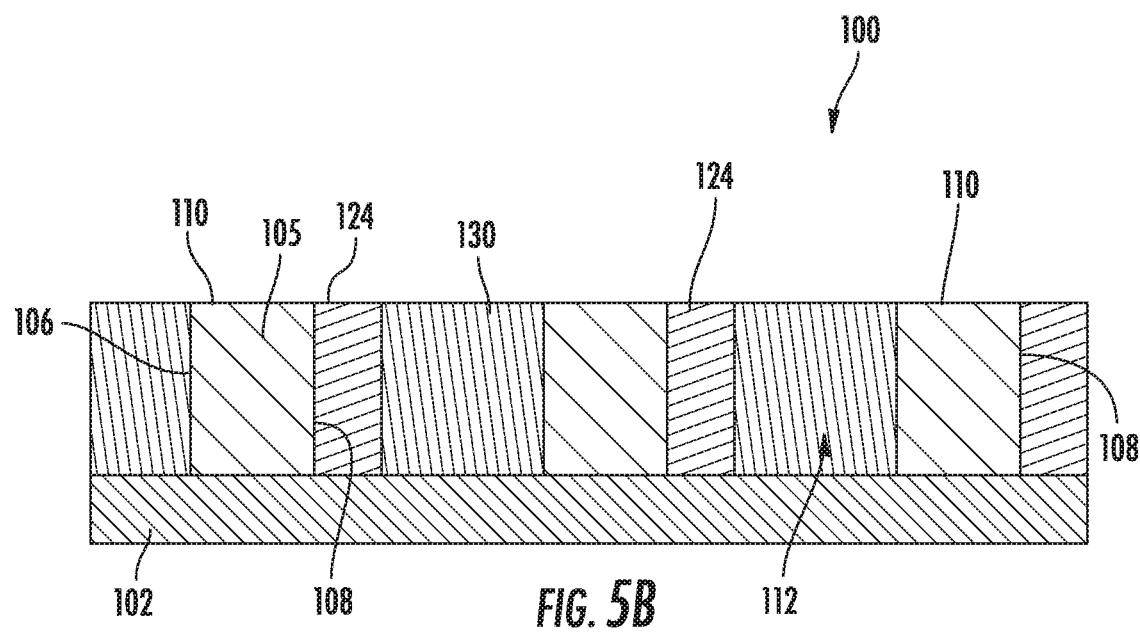
FIG. 5B is a side cross-sectional view of the device following a planarization process according to embodiments of the present disclosure.

In an alternative embodiment, as shown in FIG. 5A, the fill material 130 may be formed over the patterning structures 105 and the device layer 102 after the mask 112 has been removed from the patterning structures. The device 100 may then planarized, as shown in FIG. 5B, to reduce a vertical height of the patterning structures 105 and the metal layers 124.

Figure 6:
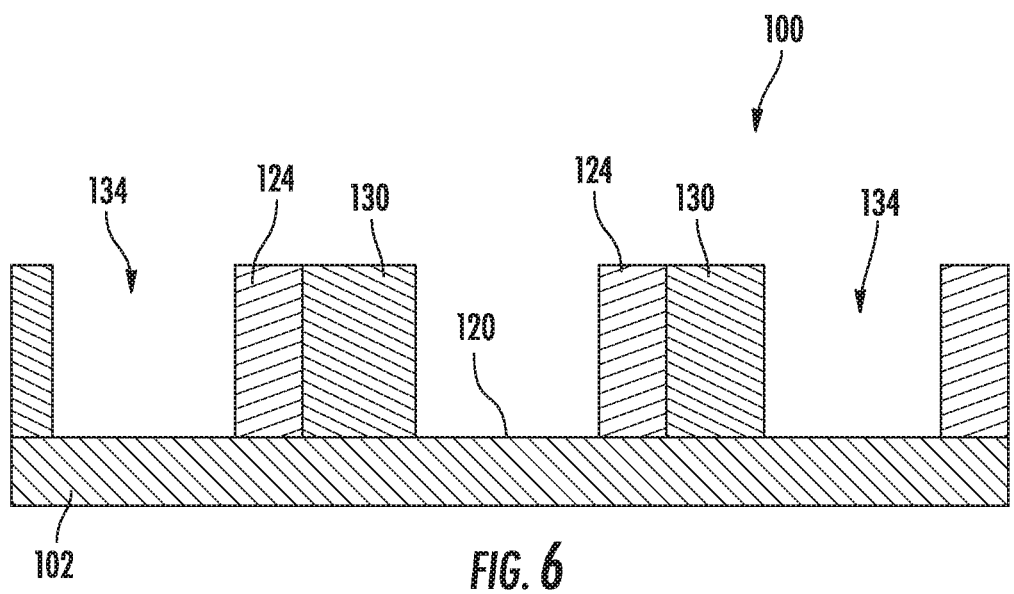
FIG. 6 is a side cross-sectional view of the device following removal of a mask and patterning structures according to embodiments of the present disclosure.

Next, as shown in FIG. 6, the patterning structures 105 and the mask 112 may be removed from the device 100 to form a set of trenches 134. In some embodiments, the patterning structures 105 and the mask 112 may be removed selective to the top surface 120 of the device layer 102. The metal layers 124 and the fill material 130 may remain. Advantageously, the patterning structures 105 and the mask 112 may be removed without bending of the metal layers 124.

Figure 7:
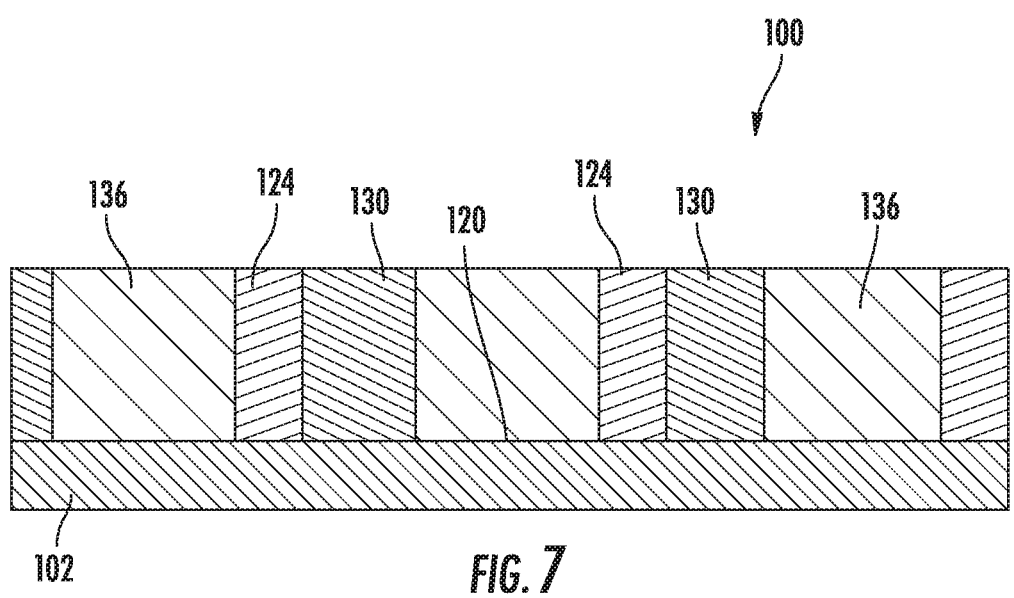
FIG. 7 is a side cross-sectional view of a second fill material formed over the device according to embodiments of the present disclosure.

Next, as shown in FIG. 7, a second fill material 136 may be formed over the device 100, including within the set of trenches 134. In some embodiments, the second fill material 136 may be gap fill oxide or nitride, which is planarized to a same height or thickness as the metal layers 124 and the fill material 130. As shown, each of the metal layers 124 may be disposed between the fill material 130 and the second fill material 136.

Figure 8:
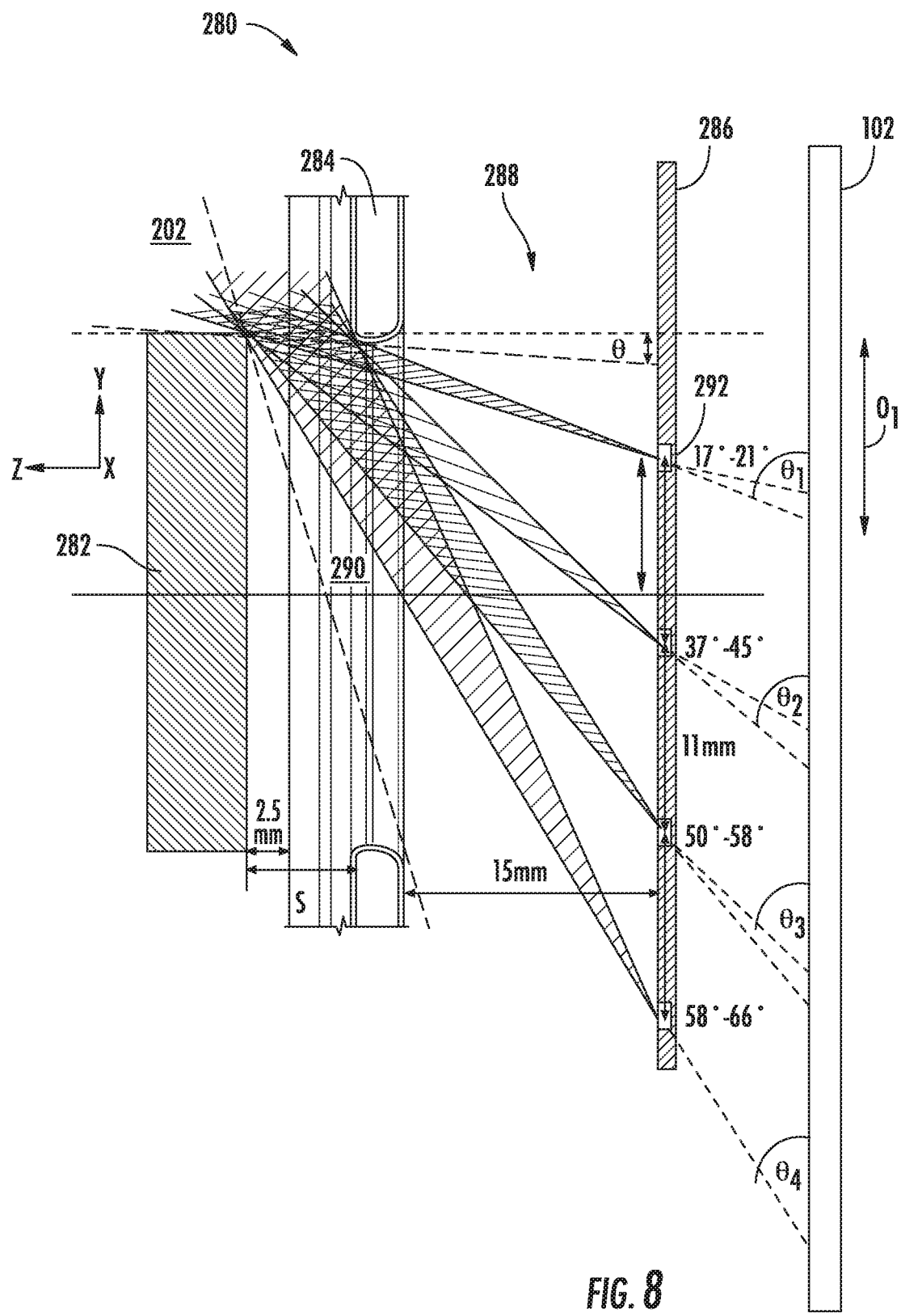
FIG. 8 shows a side view of an extraction assembly according to embodiments of the disclosure.

FIG. 8 shows a side view of another apparatus according to embodiments of the disclosure. As shown, an extraction assembly 280 may be coupled to the plasma chamber 202, and include an extraction plate 284 and a beam blocker 282. The extraction assembly 280 may further include a collimation plate 286, disposed between the extraction plate 284 and device layer 102. Extraction of an ion beam may be achieved by a bias voltage applied between the plasma chamber 202 and device layer 102, depending upon the targeted ion energy. To generate an angled ion beam, the beam blocker 282 may be arranged to block a portion of the aperture 290, formed with the extraction plate 284, so that an ion beam 288 is extracted from the plasma chamber 202 along the edge of the aperture as shown.

Notably, ions may exit the plasma chamber 202 over a range of angles. To select for a given angle of incidence (or narrow range of angles of incidence) (κ), the collimation plate 286 may be provided with a collimation aperture 292 arranged at a specific offset O with respect to an edge of the aperture 290. FIG. 8 illustrates four possible placements for the collimation aperture 292. Increasing the value of O will lead to a higher value of κ. In FIG. 8, for an offset O1, the corresponding q1 is 17-21 degrees. Larger offsets will produce larger angles of incidence. Thus, for a given placement of the collimation aperture 292, ions exiting the plasma chamber 202 will be blocked from traversing to the device layer 102, except those ions having the suitable angle of incidence to pass through the collimation aperture 292 and strike the device layer 102. Thus, by switching between different collimation plates having different value of O, the apparatus of FIG. 8 presents a convenient means to vary the angle of incidence of ions of a reactive beam to be applied to a substrate to change the coverage of the selective seed layer 126 on the patterning structures 105, as generally shown in FIGS. 1 and 3B.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a plurality of patterning structures over a device layer, each of the plurality of patterning structures including a first sidewall, a second sidewall, and an upper surface;
forming a mask by depositing a masking material at a non-zero angle of inclination relative to a perpendicular to a plane defined by a top surface of the device layer, wherein the mask is formed over just the first sidewall and the upper surface of each of the plurality of patterning structures;
selectively forming a metal layer along the second sidewall of each of the plurality of patterning structures; and
forming a fill material over the plurality of patterning structures and the device layer; and
planarizing the fill material and the mask to remove the mask from the upper surface of each of the plurality of patterning structures.

2. The method of claim 1, further comprising:
removing the plurality of patterning structures and the mask along the first sidewall of each of the plurality of patterning structures; and
forming a second fill material between each of the metal layers.

3. The method of claim 2, further comprising planarizing the second fill material after the second fill material is deposited over each of the metal layers and the fill material.

4. The method of claim 2, further comprising forming each of the metal layers between the fill material and the second fill material.

5. The method of claim 1, further comprising selectively forming the metal layer by an atomic layer deposition process.

6. The method of claim 1, further comprising forming the metal layer along just the second sidewall of each of the plurality of patterning structures.

7. The method of claim 1, wherein the masking material is prevented from impacting the top surface of the device layer in an area directly adjacent the second sidewall of each of the plurality of patterning structures.

8. The method of claim 1, further comprising forming a seed layer over the plurality of patterning structures and the device layer, wherein the mask and the metal layer are formed atop the seed layer.

9. A method of forming a semiconductor device, comprising:
providing a plurality of patterning structures over a device layer, each of the plurality of patterning structures including a first sidewall, a second sidewall, and an upper surface;
forming a mask by depositing a masking material at a non-zero angle of inclination relative to a perpendicular to a plane defined by a top surface of the device layer, wherein the mask is formed over just the first sidewall and the upper surface of each of the plurality of patterning structures;
forming a metal layer along just the second sidewall of each of the plurality of patterning structures;
forming a fill material over the plurality of patterning structures and the device layer; and
planarizing the fill material and the mask to remove the mask from the upper surface of each of the plurality of patterning structures.

10. The method of claim 9, further comprising:
removing the plurality of patterning structures and the mask along the first sidewall of each of the plurality of patterning structures; and
forming a second fill material between each of the metal layers.

11. The method of claim 10, further comprising planarizing the second fill material after the second fill material is deposited over each of the metal layers and over the fill material.

12. The method of claim 11, further comprising forming each of the metal layers between the fill material and the second fill material.

13. The method of claim 9, further comprising selectively forming the metal layer by an atomic layer deposition process.

14. The method of claim 9, further comprising delivering the masking material at the non-zero angle of inclination to prevent the mask from being formed along a portion of the top surface of the device layer in an area directly adjacent the second sidewall of each of the plurality of patterning features.

15. The method of claim 9, further comprising forming a seed layer over each of the plurality of patterning structures and over the top surface of the device layer, wherein the mask and the metal layer are formed atop the seed layer.

16. A metal line patterning method, comprising:
providing a plurality of patterning structures over a device layer, each of the plurality of patterning structures including a first sidewall, a second sidewall, and an upper surface;
forming a mask over each of the plurality of patterning structures by depositing a masking material at a non-zero angle of inclination relative to a perpendicular to a plane defined by a top surface of the device layer, wherein the masking material impacts just the first sidewall and the upper surface of each of the plurality of patterning structures;
selectively forming a metal layer along just the second sidewall of each of the plurality of patterning structures;
forming a fill material over the plurality of patterning structures and the device layer; and
planarizing the fill material and the mask to remove the mask from the upper surface of each of the plurality of patterning structures.

17. The method of claim 16, further comprising:
removing the plurality of patterning structures and the mask along the first sidewall of each of the plurality of patterning structures; and
forming a second fill material between each of the metal layers.

18. The method of claim 16, further comprising forming the metal layer along the second sidewall by an atomic layer deposition process.

19. The method of claim 16, further comprising preventing the masking material from impacting the top surface of the device layer in an area directly adjacent the second sidewall of each of the patterning structures.

* * * * *